United States Patent
Kataoka

(10) Patent No.: US 8,349,967 B2
(45) Date of Patent: Jan. 8, 2013

(54) SEALING FILM FOR SOLAR CELL AND SOLAR CELL PREPARED BY USING THE SAME

(75) Inventor: Hisataka Kataoka, Kanagawa (JP)

(73) Assignee: Bridgestone Corporation, Tokyo (JP)

( * ) Notice: Subject to any disclaimer, the term of this patent is extended or adjusted under 35 U.S.C. 154(b) by 743 days.

(21) Appl. No.: 12/097,967

(22) PCT Filed: Dec. 22, 2006

(86) PCT No.: PCT/JP2006/325617
§ 371 (c)(1),
(2), (4) Date: Jun. 18, 2008

(87) PCT Pub. No.: WO2007/072944
PCT Pub. Date: Jun. 28, 2007

(65) Prior Publication Data
US 2010/0300531 A1     Dec. 2, 2010

(30) Foreign Application Priority Data
Dec. 22, 2005   (JP) ................................ 2005-369505

(51) Int. Cl.
*C08F 220/40* (2006.01)
(52) U.S. Cl. .................. 525/330.3; 525/330.6; 525/387; 136/256; 136/259; 427/385.5; 427/393.5; 427/389.7
(58) Field of Classification Search ............... 427/385.5, 427/393.5, 389.7; 136/256, 259; 525/330.3, 525/330.6, 387
See application file for complete search history.

(56) References Cited

U.S. PATENT DOCUMENTS 6,191,353 B1 * 2/2001 Shiotsuka et al. ............ 136/256
6,245,420 B1 * 6/2001 Nishio et al. ................ 428/292.1

FOREIGN PATENT DOCUMENTS

| JP | 7-169986 A | | 7/1995 |
|---|---|---|---|
| JP | 2000-181238 A | | 6/2000 |
| JP | 2000-183381 A | | 6/2000 |
| JP | 2002-170971 A | | 6/2002 |
| JP | 2003-204073 | * | 7/2003 |
| JP | 2003-204073 A | | 7/2003 |
| WO | 02/068530 A2 | | 9/2002 |
| WO | 2004/069949 A1 | | 8/2004 |

* cited by examiner

*Primary Examiner* — Robert C Boyle
(74) *Attorney, Agent, or Firm* — Sughrue Mion, PLLC

(57) ABSTRACT

The present invention provides a sealing film for a solar cell having the improved heat resistance and light resistance and a solar cell made by using the same. A sealing film for a solar cell including ethylene/vinyl acetate copolymer and an organic peroxide, which includes a specific peroxycarbonate as the organic peroxide, and which includes a dihydroxydimethoxybenzophenone ultraviolet absorber without substantially including a hindered amine light stabilizer to prevent yellowing. A sealing film for a solar cell including ethylene/vinyl acetate copolymer and an organic peroxide, which includes a specific dialkylperoxide as the organic peroxide, and which includes dihydroxydimethoxybenzophenone ultraviolet absorber without substantially including monohydroxyalkoxybenzophenone ultraviolet absorber to prevent yellowing.

10 Claims, 1 Drawing Sheet

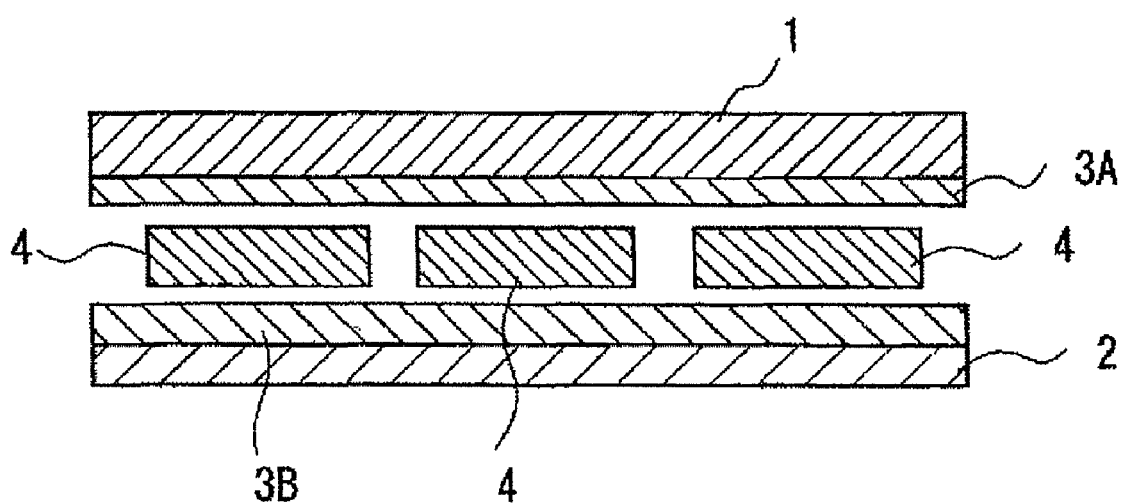

SEALING FILM FOR SOLAR CELL AND SOLAR CELL PREPARED BY USING THE SAME

BACKGROUND OF INVENTION

1. Field of the Invention

The present invention relates to a sealing film for a Solar cell which mainly consists of ethylene-vinyl acetate copolymer and a solar cell prepared by using the film, in particular, to the sealing film for a Solar cell and the solar cell which have excellent yellowing resistance.

2. Description of the Related Art

A solar cell has been paid attention as a device directly converting solar energy into electric energy from the viewpoints of effective use of natural resources and prevention of environment deterioration, and various solar cells have been developed.

In a solar cell, as described in FIG. 1, photovoltaic elements 4 made of silicon etc. are sealed by the sealing films 3A, 3B made of EVA (ethylene-vinyl acetate copolymer) film between a glass plate 1 as a transparent front surface (light receiving surface) protection member and a rear surface protection member 2 (backside covering material). A sealing film placed at a light-receiving surface side of the cells is referred to "surface sealing film", and a sealing film placed at a rear surface side of the cells is referred to "rear surface sealing film".

A solar cell is prepared by the following steps: a glass plate 1, surface EVA film for sealing 3A, silicon photovoltaic elements 4, rear surface EVA film for sealing 3B and a backside covering material 2 are superposed in this order and cross-linked the EVA by heating and pressing to unify the superposed product, whereby a solar cell can be obtained.

From a viewpoint of the improvement of the power generation efficiency, it is desired strongly to introduce light falling on the solar cell into the photovoltaic elements of the solar cell as effectively as possible. Therefore, it is needed for the EVA film for sealing to have excellent transparent and transmit most of the light without absorbing and reflecting the light. In addition, when the solar cell is used for a long time, there are problems that the transmission of the light may be reduced and the defective appearance is caused by turning the EVA film for sealing yellow because of the influence of light and heat.

In order to prevent such yellowing, for example various ultraviolet absorbers and light stabilizers are used in the EVA film for sealing. For example, a patent document 1 (JP-A-H07 (1995)-169986) discloses that 2,5-dimethyl-2,5-di(t-butylperoxy)hexane falling into peroxyester peroxide is used as organic peroxide (cross-linking agent), and 2-hydroxy-4-n-octoxybenzophenone falling into monohydroxyalkoxybenzophenone type is used as the ultraviolet absorber. In addition, a patent document 2 (JP-A-2000-183381) discloses that 1,1-bis(t-butylperoxy)3,3,5-trimethylcyclohexane is used as organic peroxide and 2-hydroxy-4-n-octoxybenzophenone, which is the same as above, is used as ultraviolet absorber.

SUMMARY OF THE INVENTION

Study conducted by the inventor of the present application has revealed that the conventional ultraviolet absorbers or light stabilizers are apt to have harmful effects on the prevention of the yellowing, when are combined with the other ultraviolet absorbers. According to a further study by the inventor, it has been found that the types of the ultraviolet absorber exerting the harmful effect vary depending on the types of the organic peroxide used.

Therefore, the purpose of the present invention is to provide a sealing film for a Solar cell having improved light resistance and heat resistance to solve the above conventional problems.

In addition, the purpose of the present invention is to provide a solar cell including the above sealing film and having the improved light resistance and heat resistance.

The above objects can be accomplished by a sealing film for a Solar cell comprising ethylene/vinyl acetate copolymer and organic peroxide (cross-linking agent), which comprises as the organic peroxide peroxyester of a formula I:

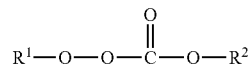

in which $R^1$ represents a branched alkyl group having 3 to 5 carbon atoms, and $R^2$ represents a branched alkyl group having 6 to 9 carbon atoms, and which comprises dihydroxydimethoxybenzophenone as an ultraviolet absorber without comprising substantially hindered amine as a light stabilizer to prevent yellowing.

In addition, the above objects can be accomplished by a sealing film for a Solar cell comprising ethylene/vinyl acetate copolymer and organic peroxide (cross-linking agent), which comprises as the organic peroxide dialkylperoxide of a formula II:

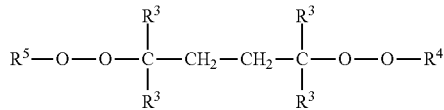

in which $R^3$s represent independently alkyl group having 1 to 3 carbon atoms, $R^4$ represents a branched alkyl group having 3 to 5 carbon atoms, and $R^5$ represents a branched alkyl group having 3 to 5 carbon atoms, and which comprises dihydroxydimethoxybenzophenone as an ultraviolet absorber without comprising substantially monohydroxyalkoxybenzophenone as an ultraviolet absorber to prevent yellowing.

The preferred embodiments of the sealing films according to the present invention are set forth below;

(1) $R^1$ of the formula I is t-butyl group and the $R^2$ of the formula I is 2-ethylhexyl group.

(2) The hindered amine light stabilizer is bis(2,2,6,6-tetramethyl-4-piperidyl)sebacate. The amount represented by the phrase "not comprised substantially" is less than 0.1 parts by weight (in particular less than 0.01 parts by weight) based to 100 parts by weight of ethylene-vinyl acetate copolymer.

(3) $R^3$ of the formula II is methyl and $R^4$ and $R^5$ of the formula II are t-butyl.

(4) The monohydroxyalkoxybenzophenone ultraviolet absorber is 2-hydroxy-4-octyloxybenzophenone. The amount represented by the phrase "not comprised substantially" is less than 0.2 parts by weight (in particular less than 0.02 parts by weight) based to 100 parts by weight of the ethylene/vinyl acetate copolymer.

5) The dihydroxydimethoxybenzophenone ultraviolet absorber is 2,2-dihydroxy-4,4-dimethoxybenzophenone.

(6) The dihydroxydimethoxybenzophenone ultraviolet absorber is comprised in the amount of 0.01 to 1.0 part by weight based on 100 parts by weight of the ethylene/vinyl acetate copolymer. Use of the organic peroxide renders the effect of the excellent yellowing resistance.

(7) The sealing film comprises the organic peroxide in the amount of 0.1 to 5.0 parts by weight based on 100 parts by weight of the ethylene/vinyl acetate copolymer.

(8) The sealing film comprises a cross-linking auxiliary (a compound having a radical polymerizable group) in the amount of 0.1 to 5.0 part by weight based on 100 parts by weight of the ethylene/vinyl acetate copolymer.

(9) A vinyl acetate unit of the ethylene/vinyl acetate copolymer is contained in the amount of 20 to 35% by weight based on 100 parts by weight of the ethylene/vinyl acetate copolymer. The feature ensures excellent transparency.

In addition, the present invention is to provide a solar cell comprising a transparent front surface protection member, a rear surface protection member and sealing films together with photovoltaic elements interposed therebetween to seal them, wherein the above-mentioned film for a Solar cell is arranged between the photovoltaic elements and the rear surface protection member to be cross-linked and combined with each other.

EFFECT OF THE INVENTION

The sealing film for a Solar cell of the present invention comprises the ethylene-vinyl acetate copolymer (EVA) as a major ingredient, the specific organic peroxide and ultraviolet absorber, without comprising a specific ultraviolet absorber or light stabilizer which is generally used. This constitution presents remarkably the sealing film from the yellowing when the sealing film is used for a long time whereby the sealing film is improved in light stability and heat resistance.

Therefore, the solar cell having the above-mentioned sealing film for a Solar cell has the improved light stability, weather resistance and heat resistance.

BRIEF DESCRIPTION OF THE DRAWINGS

FIG. 1 is a section view of a general solar cell.

DESCRIPTION OF THE REFERENCE NUMBERS

1: glass plate
2: backside covering material
3A, 3B: EVA film
4: silicon photovoltaic elements

DETAILED DESCRIPTION OF THE INVENTION

The sealing film for a Solar cell of the present invention comprises the ethylene/vinyl acetate copolymer (EVA) as a major ingredient, the specific organic peroxide (cross-linking agent) and the specific ultraviolet absorber without comprising a specific ultraviolet absorber or light stabilizers used generally.

When the sealing film of the present invention comprises a peroxyester, as the organic peroxide, having a formula I:

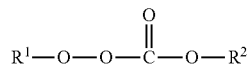

in which $R^1$ represents a branched alkyl group having 3 to 5 carbon atoms, and $R^2$ represents a branched alkyl group having 6 to 9 carbon atoms, and comprises the dihydroxydimethoxybenzophenone as an ultraviolet absorber without comprising substantially the hindered amine as a light stabilizers used generally to prevent yellowing. Though the hindered amine light stabilizer is a radical scavenger which is developed as a stabilizer for the light, it is known in these days that the hindered amine light stabilizer shows extended resistance. For the reason, the present inventor has reviewed conventional light stabilizer, and found out that an undesirable effect is obtained when the above-mentioned organic peroxide is combined with it. The undesirable effect can be significantly obtained when the hindered amine light stabilizer is used in combination with the dihydroxydimethoxybenzophenone ultraviolet absorber. The mechanism of it is unclear.

In the formula I, $R^1$ is the branched alkyl group having 3 to 5 carbon atoms, for example isopropyl, t-butyl, i-butyl, sec-butyl, isopentyl, tert-pentyl and neopentyl. In particular, t-butyl is preferred. $R^2$ is branched alkyl group having 6 to 9 carbon atoms, for example 1-ethylbutyl, 1-methylheptyl, 1-methylhexyl, 1-ethylhexyl, 1-ethylheptyl, 2-ethylbutyl, 2-methylheptyl, 2-methylhexyl, 2-ethylhexyl, and 2-ethylheptyl. In particular, 2-ethylhexyl is preferred.

The hindered amine as a light stabilize is generally a bis(2,2,6,6-tetramethyl-4-piperidyl)sebacate, for example, a trade name: SANOL LS770 available from Sankyo Co., Ltd. The amount of this compound represented by the phrase "not comprised substantially" is less than 0.1 parts by weight (in particular less than 0.01 parts by weight) based to 100 parts by weight of ethylene/vinyl acetate copolymer.

Example of the dihydroxydimethoxybenzophenone as an ultraviolet absorber used to prevent the yellowing includes, for example, 2-hydroxy-4-methoxybenzophenone [e.g., a trade name: UPINAL 3040 available from BASF Co., Ltd], and 2,2-dihydroxy-4,4-dimethoxybenzophenone [e.g., a trade name: UPINAL 3049 available from BASF Co., Ltd], in particular, 2,2-dihydroxy-4,4-dimethoxybenzophenone is preferred.

When the sealing film for a Solar cell of the present invention comprises the dialkylperoxide, as the organic peroxide, having a formula II:

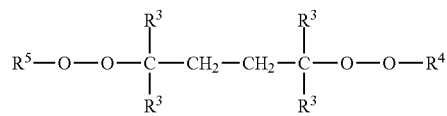

in which $R^3$s represent independently alkyl group having 1 to 3 carbon atoms, $R^4$ represents a branched alkyl group having 3 to 5 carbon atoms, and $R^5$ represents a branched alkyl group having 3 to 5 carbon atoms, and comprises the dihydroxydimethoxybenzophenone as an ultraviolet absorber without comprising substantially the monohydroxyalkoxybenzophenone as an ultraviolet absorber to prevent the yellowing. In general, the monohydroxyalkoxybenzophenone ultraviolet absorber has been used as an ultraviolet absorber. However, the study of the ultraviolet absorber by the present inventor reveals that a harmful effect is resulted from a combination of the organic peroxide. In particular when the monohydroxyalkoxybenzophenone ultraviolet absorber is used in combination with the dihydroxydimethoxybenzophenone ultraviolet absorber, there is inclination that the harmful effect is markedly brought about.

In the formula II, $R^3$s are independently alkyl group having 1 to 3 carbon atoms, for example, methyl, ethyl and i-propyl. $R^4$ is branched alkyl group having 3 to 5 carbon atoms, for example, i-propyl, t-butyl, i-butyl, sec-butyl, isopentyl, tert-pentyl and neopentyl. $R^5$ is a branched alkyl group having 3 to 5 carbon atoms, for example, i-propyl, t-butyl, i-butyl, sec-butyl, isopentyl, tert-pentyl and neopentyl. It is preferred that all the $R^3$ are the same, in particular methyl. It is preferred that $R^4$ and $R^5$ are the same as each other, t-butyl, i-butyl, sec-butyl, in particular t-butyl.

Examples of the monohydroxyalkoxybenzophenone ultraviolet absorber include, 2-hydroxy-4-octyloxybenzophenone, 2-hydroxy-4-methoxy-5-sulfobenzophenone. The 2-hydroxy-4-octyloxybenzophenone [e.g., a trade name: Sumisorb 130 available from Sumitomo Chemical Co., Ltd] is general and especially effective. The amount of this compound represented by the phrase "not comprised substantially" is less than 0.2 parts by weight (in particular less than 0.02 parts by weight) based to 100 parts by weight of ethylene/vinyl acetate copolymer.

The dihydroxydimethoxybenzophenone ultraviolet absorber used here is mentioned above.

As mentioned above, in the sealing film for a Solar cell of the present invention, the yellowing caused by the color deterioration is significantly prevented, and light resistance and heat resistance are improved.

The sealing film for a Solar cell of the present invention can be prepared easily by a conventional process for preparing sheet using the EVA resin composition having the above constituent.

The thickness of the sealing film for a Solar cell of the present invention is generally in the range of 50 μm to 2 mm.

The EVA resin composition is explained below.

An organic resin used for the EVA resin composition of the present invention comprises ethylene/vinyl acetate copolymer (EVA). The EVA may be used together with polyvinyl acetal resin (e.g., polyvinyl formal, polyvinyl butyral (PVB), modified PVB), and/or polyvinyl chloride, if necessary. In this case, the PVB is preferred.

In EVA, the content of vinyl acetate preferably is in the range of 10 to 40% by weight, preferably 10 to 36% by weight, more preferably 10 to 33% by weight, in particular 10 to 28% by weight. When the content of vinyl acetate is more than 40% by weight, the viscosity of the resin is apt to be reduced, and the resin may be flowed out from between the glass plate and the backside covering material at the sealing. In addition, it is difficult to handle the resin because of the increase of the adhesion property of it. On the other hand, when the content of vinyl acetate is less than 10% by weight, the workability of the resin is reduced, and the film obtained become too be rigid and is apt to damage the cell at the manufacturing of the solar cell.

The melt flow rate of the EVA is preferably in the range of 0.7 to 40 g/10 min, in particular 1.5 to 15 g/10 min.

The EVA resin composition can obtain a cross-linked structure by comprising the organic peroxide (cross-linking agent) to improve the whether resistance. The present invention comprises the specific organic peroxide. However, the specific organic peroxide can be used together with other organic peroxide.

As the organic peroxide, any materials that can be decomposed at a temperature of not less than 100° C. to generate radical(s) can be employed. In the consideration of condition for preparing the composition, especially, preferred are those having a decomposition temperature of not less than 70° C. in a half-life of 10 hours. Examples of the organic peroxide include 2,5-dimethylhexane; 2,5-dihydroperoxide; 3-di-t-butylperoxide; t-dicumylperoxide; 2,5-dimethyl-2,5-di(t-butylperoxy)hexine; dicumyl peroxide; α,α'-bis(t-butylperoxy-isopropyl)benzene; n-butyl-4,4-bis(t-butylperoxy)butane; 2,2-bis(t-butylperoxy)butane; 1,1-bis(t-butylperoxy)cyclohexane; 1,1-bis(t-butylperoxy)-3,3,5-trimethylcyclohexane; t-butylperoxybenzoate; benzoyl peroxide.

The content of the organic peroxide is generally less than 5 parts by weight, preferably in an amount of 0.1 to 5 parts by weight, especially in an amount of 0.1 to 3 parts by weight based on 100 parts by weight of EVA.

A silane coupling agent can be added to the EVA resin in order to enhance the adhesive strength with the photovoltaic element. Examples of the silane coupling agent include γ-chloropropyltrimethoxysilane, vinyltrichlorosilane, vinyltriethoxysilane, vinyl-tris-(β-methoxyethoxy)silane, γ-methacryloxypropyltrimethoxysilane, β-(3,4-ethoxycyclohexyl)ethyltrimethoxysilane, γ-glycidoxypropyltrimethoxysilane, vinyltriacetoxysilane, vinyltrichlorosilane, γ-mercaptopropyltrimethoxysilane, γ-aminopropyltrimethoxysilane, N-β-(aminoethyl)-γ-aminopropyltrimethoxysilane. The silane coupling agent is used in an amount of not more than 5 weight by part, preferably in an amount of 0.1 to 2 weight by part based on 100 parts by weight of EVA.

In addition, in order to improve the stability of EVA, it is possible to add hydroquinone; hydroquinonemonomethylether; p-benzoquinone; methylhydroquinone. These are used in an amount of less than 5 parts by weight based on 100 parts by weight of EVA.

In the present invention, as mentioned above, the specific ultraviolet absorbers are used in combination with the specific organic peroxide together with EVA. However, it is possible to add further coloring agent, UV-absorber, aging inhibitors, discoloration inhibitors, if necessary. Examples of the coloring agent include inorganic pigment, such as metal oxide and metal powder, organic pigment, such as azo type, phthalocyanine type, azi type, acid or basic dye type lake. The UV-absorber includes benzotriazole type, such as 2-(2'-hydroxy-5-methylphenyl)benzotriazole; hindered phenol type, such as phenylsalkylate; hindered phenol type, such as p-t-butylphenylsalkylate. The aging inhibitor includes amine type; phenol type; bisphenyl type.

The sealing film for a Solar cell of the present invention can be prepared by a conventional process, for example, by heating and rolling the above EVA composition by using extrusion molding method or calendaring molding method. The heating temperature preferably is a temperature at which the cross-linking agent does not react or does not mostly react. For example, the temperature is preferably in the range of 40 to 70° C.

In order to prepare the solar cell by using the sealing film for a Solar cell of the present invention, as shown in FIG. 1, when glass plate 1, EVA film 3A, silicon photovoltaic elements 4, EVA film 3B and backside covering material 2 are laminated, the sealing film of the present invention is used as the backside EVA film 3B, and the sealing film of the present invention is also used as the surface EVA film 3A. The laminated body may be heat-pressed by using vacuum laminator according to conventional methods, preferably under the conditions of temperature of 120 to 150° C., degassing time period of 2 to 15 minutes, pressure of press of 0.5 to 1 kg/cm$^2$, and pressing time period of 8 to 45 minutes. At the heat-pressing, EVA films 3A and 3B are cross-linked to form the sealing film having improved light resistance, heat resistance and weather resistance. The glass plate 1 of the present invention generally comprises silicate glass. The thickness of the glass plate is generally in the range of 0.1 to 10 mm, preferably 0.3 to 5 mm. The glass plate 1 is tempered in heat or chemical resistance.

The backguard 2 is generally plastic film (such as polyethylene terephthalate (PET), polytetrafluoroethylene (PTFE)). In the consideration of heat resistance, polyethylene fluoride film is preferred.

EXAMPLE

The present invention is illustrated in detail below using the following Examples.

Example 1

[Formulation of EVA resin composition 1 (part by weight)]

| | |
|---|---|
| EVA resin: | 100 |
| (content of vinyl acetate 28 wt. %, melt flow rate 15 g/10 min) | |
| Cross-linking agent 1: | 0.35 |
| (t-Butylperoxy-2-ethylhexyl carbonate) | |
| Cross-linking auxiliary (triallyl isocyanurate): | 0.5 |
| Ultraviolet absorber 1: | 0.03 |
| (2,2-Dihydroxy-4,4-dimethoxybenzophenone) | |

An EVA film is prepared by calendaring molding the above EVA resin composition at 80° C. The thickness of the film is 600 μm.

A solar cell was prepared by using the EVA films as the surface EVA film 3A and the backside EVA film 3B, and sealing silicon photovoltaic elements 4 between a glass plate 1 of a thickness of 3 mm and a backside covering material 2 made of a polyethylene fluoride film of a thickness of 38 μm, as shown in FIG. 1. The sealing was carried out by heating and pressing under the conditions of temperature of 150° C., degassing time of 3 minutes and pressing time of 15 minutes to cross-link the EVA.

Comparative Example 1

The procedures of Example 1 were carried out except for adding 0.1 part by weight of a hindered amine light stabilizer [bis(2,2,6,6-tetramethyl-4-piperidyl)sebacate] to the EVA resin composition 1.

Example 2

[Formulation of EVA resin composition 2 (part by weight)]

| | |
|---|---|
| EVA resin: | 100 |
| (content of vinyl acetate 26 wt. %, melt flow rate 4 g/10 min) | |
| Cross-linking agent 2: | 1.3 |
| (2,5-Dimethyl-2,5-bis(t-buthylperoxy)hexane) | |
| Cross-linking auxiliary (triallyl isocyanurate): | 2.0 |
| Ultraviolet absorber 1: | 0.03 |
| (2,2-Dihydroxy-4,4-dimethoxybenzophenone) | |
| Hindered amine light stabilizer | 0.1 |
| [Bis(2,2,6,6-tetramethyl-4-piperidyl)sebacate] | |

An EVA film is prepared by calendaring molding the above EVA resin composition at 80° C. The thickness of the film is 600 μm.

A solar cell was prepared by using the EVA films as the surface EVA film 3A and the backside EVA film 3B, and sealing silicon photovoltaic elements 4 between a glass plate 1 of a thickness of 3 mm and a backside covering material 2 made of a polyethylene fluoride film of a thickness of 38 μm, as shown in FIG. 1. The sealing was carried out by heating and pressing under the conditions of temperature of 150° C., degassing time of 3 minutes and pressing time of 15 minutes to cross-link the EVA.

Comparative Example 2

The procedures of Example 2 were carried out except for adding 0.2 part by weight of a ultraviolet absorber 2 of 2-hydroxy-4-octyloxybenzophenone to the EVA resin composition 2 without adding the ultraviolet absorber 1 of 2,2-dihydroxy-4,4-dimethoxybenzophenone.

<Evaluation of the Sealing Film for a Solar Cell>

(1) Heat Resistance (Durability Test Under Heating (130° C.))

The EVA films obtained in the examples and the comparative examples are inserted between the two float glasses, and preliminary molded under the conditions of temperature of 90-100° C., degassing time of 2 minutes and pressing time of 8 minutes, and then introduced into a heat-resistant oven set to 150° C. for 45 minutes to cross-link it.

The resultant cross-linked EVA film which is inserted between the glasses is stored at 130° C. for 1000 hours. The difference (ΔYI) between the YI values before and after the storage is calculated to evaluate the degree of the yellowing caused by the storage.

The ΔYI value is measured according to JIS-K-7105-6 (1981).

(2) Light Resistance (Weather Resistance) (Accelerated Endurance Test)

An EVA film obtained by the same manner as the above (1) was irradiated with ultraviolet (100 mW/cm$^2$) for 1000 hours under environment of temperature of 63° C. and relative humidity of 50%. The difference between the YI values (ΔYI) before and after the irradiation is calculated to evaluate the degree of the yellowing caused by the irradiation.

The ΔYI value is measured by the same manner as in the above (1).

Results are shown below.

| | | Example 1 | Comparative example 1 | Example 2 | Comparative example 2 |
|---|---|---|---|---|---|
| Formulation | EVA (VA: 28%) | 100 | 100 | — | — |
| | EVA (VA: 26%) | — | — | 100 | 100 |
| | Cross-linking agent 1 | 0.35 | 0.35 | — | — |
| | Cross-linking agent 2 | — | — | 1.3 | 1.3 |
| | Cross-linking auxiliary | 0.5 | 0.5 | 2.0 | 2.0 |
| | Ultraviolet absorber 1 | 0.03 | 0.03 | 0.03 | — |
| | Ultraviolet absorber 2 | — | — | — | 0.2 |
| | Light stabilizer | — | 0.1 | 0.1 | 0.1 |

-continued

| | Example 1 | Comparative example 1 | Example 2 | Comparative example 2 |
|---|---|---|---|---|
| Evaluation result | | | | |
| Heat resistant (ΔYI) | 2.0 | 4.7 | 0.7 | 5.2 |
| Light resistant (ΔYI) | 1.1 | 1.3 | 0.2 | 3.8 |

As apparent from the above results, the sealing films of the present invention have excellent heat resistance and light resistance (endurance) by using the specific cross-linking agent in combination with the specific ultraviolet absorber and without using the specific ultraviolet absorber and the light stabilizer (i.e., Example 1 uses the cross-linking agent 1, and the ultraviolet absorber 1 and does not use the light stabilizer; Example 2 uses the cross-linking agent 2, and the ultraviolet absorber 1 and dose not use the ultraviolet absorber 2). On the other hand, in the comparative examples do not show sufficient because the additives which did not be used in the examples are used.

Therefore, the solar cell using the sealing film of the present invention has excellent heat resistance and light resistance (durability).

The invention claimed is:

1. A sealing film for a solar cell comprising ethylene/vinyl acetate copolymer having vinyl acetate content in the range of 10 to 28% by weight and organic peroxide,
which comprises t-butylperoxy-2-ethylhexyl carbonate as the organic peroxide,

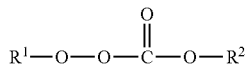

and
which comprises dihydroxydimethoxybenzophenone as an ultraviolet absorber without substantially comprising hindered amine as an light stabilizer to prevent yellowing.

2. A sealing film for a solar cell comprising ethylene/vinyl acetate copolymer having vinyl acetate content in the range of 10 to 28% by weight and organic peroxide,
which comprises 2,5-dimethyl-2,5-bis(t-butylperoxy)hexane as the organic peroxide, and
which comprises dihydroxydimethoxybenzophenone as an ultraviolet absorber without comprising substantially monohydroxyalkoxybenzophenone as an ultraviolet absorber to prevent yellowing.

3. The sealing film for a solar cell as defined in claim 1, wherein the hindered amine is bis(2,2,6,6-tetramethyl-4-piperidyl)sebacate.

4. The sealing film for a solar cell as defined in claim 2, wherein the monohydroxyalkoxybenzophenone ultraviolet absorber is 2-hydroxy-4-octyloxy-benzophenone.

5. The sealing film for a solar cell as defined in claim 1, wherein the dihydroxydimethoxybenzophenone is 2,2-dihydroxy-4,4-dimethoxy-benzophenone.

6. The sealing film for a solar cell as defined in claim 1, wherein the dihydroxydimethoxybenzophenone is contained in the amount of 0.01 to 1.0 part by weight based on 100 parts by weight of the ethylene/vinyl acetate copolymer.

7. The sealing film for a solar cell as defined in claim 1, which comprises the organic peroxide in the amount of 0.1 to 5.0 parts by weight based on 100 parts by weight of the ethylene/vinyl acetate copolymer.

8. The sealing film for a solar cell as defined in claim 1, which further comprises a cross-linking auxiliary in the amount of 0.1 to 5.0 part by weight based on 100 parts by weight of the ethylene/vinyl acetate copolymer.

9. The sealing film for a solar cell as defined in claim 1, wherein the ethylene-vinyl acetate copolymer contains a vinyl acetate unit in the amount of 10 to 26% by weight.

10. A solar cell comprising a transparent front surface protection member, a rear surface protection member and sealing films interposed together with photovoltaic elements therebetween to seal them,
wherein the film for a solar cell as defined in claim 1 is arranged between the photovoltaic elements and the rear surface protection member to be cross-linked and combined with each other.

* * * * *